United States Patent [19]

Tyson

[11] Patent Number: 5,317,181
[45] Date of Patent: May 31, 1994

[54] ALTERNATIVE BODY CONTACT FOR FULLY-DEPLETED SILICON-ON-INSULATOR TRANSISTORS

[75] Inventor: Scott M. Tyson, Colorado Springs, Colo.

[73] Assignee: United Technologies Corporation, Hartford, Conn.

[21] Appl. No.: 942,996

[22] Filed: Sep. 10, 1992

[51] Int. Cl.$^5$ .......................................... H01L 27/01
[52] U.S. Cl. ................... 257/347; 257/354; 257/622
[58] Field of Search ............... 257/347, 348, 349, 354, 257/622

[56] References Cited

U.S. PATENT DOCUMENTS

| | | | |
|---|---|---|---|
| 4,906,587 | 3/1990 | Blake | 437/41 |
| 4,946,799 | 8/1990 | Blake et al. | 437/41 |
| 5,001,528 | 3/1991 | Bahramen | 257/351 |
| 5,079,605 | 1/1992 | Blake | 257/349 |
| 5,095,348 | 3/1992 | Houston | 257/349 |
| 5,145,802 | 9/1992 | Tyson et al. | 437/63 |

OTHER PUBLICATIONS

Matloubian, Mishel, "Smart Body Contact for SOI MOSFETS", Semiconductor Process and Design Center, Texas Instruments Inc.

*Primary Examiner*—Robert Limanek
*Attorney, Agent, or Firm*—Richard H. Kosakowski

[57] ABSTRACT

Two preferred embodiments for an alternative body contact are disclosed for fully-depleted silicon-on-insulator transistors. In one preferred embodiment, body contact is made by extending the mesa ends of the body ties down to, and merging them with, mesa regions of an nFET source and using self-aligned silicide (commonly known as salicide) to make a connection to an underlying nFET well. In this first embodiment, the mesas of the body ties merge with the mesa of the source and salicide is used to short out these regions. In another preferred embodiment, body contact is made by extending the mesa ends of the body ties down to the nFET source; however, the mesas are not merged. In this second embodiment, metal routing, which is commonly used to electrically connect circuit elements, is extended to connect to the mesa regions of the body ties. In both embodiments, the body ties are active until the onset of full depletion; however, at the onset of full depletion, the body ties are electrically severed.

15 Claims, 2 Drawing Sheets

ALTERNATIVE BODY CONTACT FOR FULLY-DEPLETED SILICON-ON-INSULATOR TRANSISTORS

BACKGROUND OF THE INVENTION

The present invention relates to the field of integrated circuit fabrication. More specifically, the present invention relates to the field of transistor fabrication in silicon-on-insulator structures.

Silicon-on-insulator (SOI) technology has become increasingly important in the field of integrated circuits. In SOI fabrication, a layer of semiconductor material overlies an insulating layer; typically, a single crystal layer of silicon overlies a layer of silicon dioxide, which itself overlies a silicon substrate. When sapphire is substituted as the insulating layer, replacing silicon dioxide, a similar technology results, commonly known as silicon-on-sapphire (SOS). Both SOI and SOS devices offer inherent radiation hardness, better high temperature performance, and reduced parasitic capacitance. Consequently, SOI or SOS technology is well suited for high performance and high density integrated circuits.

One problem presented by the use of silicon-on-insulator structures is the effect of the floating body node on the characteristics of field effect transistors. In particular, SOI devices exhibit various floating body effects due to the lack of an effective contact to the body or well region. This floating body, however, provides some advantages to the operation of the device. For example, a floating body region provides higher drive current through the channel region, which provides for faster operation of integrated circuits.

At some point in the operation of the device, it is necessary to contact the floating body of an SOI device. One departure from typical techniques used to contact the floating body was disclosed in U.S. Pat. No. 5,095,348 to Houston. Houston reveals a method and structure which allows for a floating channel region when a voltage is applied which turns the main transistor on and a body-contacting transistor, also referred to as a channel transistor, off. On the other hand, when a voltage to turn off the main transistor is applied, the body-contacting transistor is turned on, thus tying the well to the reference voltage. This tying of the well can only be accomplished, however, if the threshold voltage, $V_T$, of the body-contacting transistor is carefully set. Unfortunately, carefully setting the appropriate threshold voltage is not easy. Setting this threshold voltage can become an even more complex processing problem if the threshold voltage necessary to tie the well differs from the threshold voltage desired on other channel devices. Furthermore, because the Houston device includes both a main transistor and a body-contacting transistor, it covers a large area.

Bipolar snapback is another problem that reduces the effectiveness of these SOI and SOS transistors. In transistor operation, electrons move across the channel and possess enough energy such that they cause impact ionization of other lattice sites, creating an additional electron-hole pair. This newly created hole attempts to recombine at the source; in the meantime, however, it raises the well potential. This raised potential causes more electrons to be injected. As impact ionization occurs and more electron-hole pairs are created, these holes continue to raise the well potential. Eventually, the transistor enters the snapback state and latches on; in this state, the transistor cannot be shut off unless the power supply is removed.

Accordingly, it is the primary object of this invention to provide contact to a floating body of a silicon-on-insulator transistor which involves less complicated processing and design considerations.

It is another object of this invention to provide a contact to the body which does not require the user to carefully set a threshold voltage.

It is a further object of this invention to provide a transistor that can sufficiently remove the holes so as not to raise the well potential, thus, preventing the device from entering the snapback state.

It is still another object to provide a transistor which covers a smaller area, thus reducing the overall size of the transistor.

It is yet another object to provide a transistor that takes advantage of the fact that when the transistor is fully depleted, this fully-depleted condition can act as a switch for connecting the floating body.

The above and other objects and advantages of this invention will become more readily apparent when the following description is read in conjunction with the accompanying drawings.

SUMMARY OF THE INVENTION

Two preferred embodiments for a body contact for fully-depleted silicon-on-insulator transistors are shown.

In one preferred embodiment, body contact is made by extending the mesa ends of the body ties down to the nFET source and using self-aligned silicide (commonly known as salicide) to make a connection to an underlying nFET well. In this embodiment, these mesa regions merge with the mesa of the source. Salicide is then used to short out the N+ to P+ diodes, thus electrically tying the two regions together.

In another preferred embodiment, body contact is made by extending the mesa regions down to an nFET source; however, unlike the first embodiment, the mesa regions are not merged. Metal routing, rather than salicide, is used to short out and electrically connect the N+ and P+ regions.

In both embodiments, one common inventive aspect resides in having body ties that are active until the onset of full depletion. Then, at the onset of full depletion, the body ties are severed. Consequently, one gets the advantages of a body-tied device when needed to prevent snapback. Then, when full depletion occurs, and the body ties are severed, one can take advantage of a non-body-tied device and its better performance capabilities.

DETAILED DESCRIPTION OF THE PREFERRED EMBODIMENTS

Figure 1:
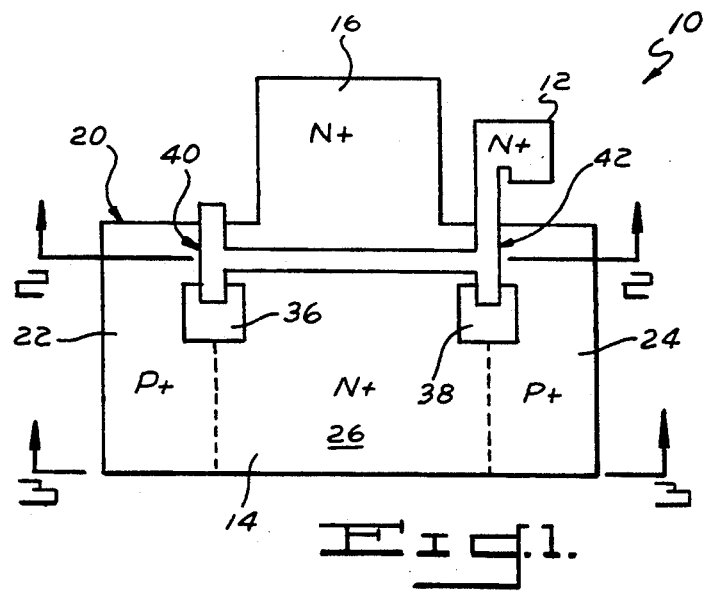
FIG. 1 plan view of a preferred embodiment of a body contact in accordance with the present invention, showing the mesas in a merged state.

Referring to the drawings in detail, two embodiments of a floating body contact are shown. The first embodiment is referenced by two-digit numbers, 10-99, and shown in FIGS. 1-3. The second embodiment is referenced by three-digit numbers, 100-199, and shown in FIGS. 4-6.

One preferred embodiment of a floating body contact is shown and generally designated by the reference numeral 10. See FIG. 1. This preferred embodiment basically comprises a CMOS, silicon-on-insulator transistor comprised of a gate 12, a source 14, a drain 16, and a well 18 underlying the gate 12, constructed within a silicon mesa 20, wherein mesa regions 22, 24 extend down to the source 14 and merge with the source 14; then, self-aligned silicide (salicide) 26 is used to connect the mesa regions 22, 24 to the source 14.

Figure 2:
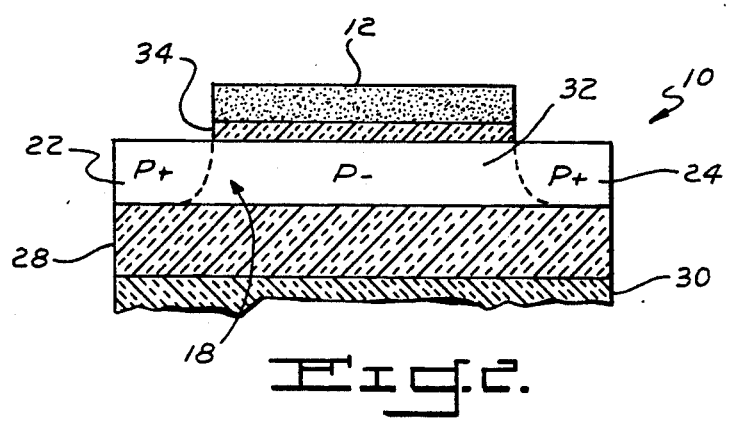
FIG. 2 is a cross-sectional view of the body contact shown in FIG. 1, taken along line 2—2.
Figure 3:
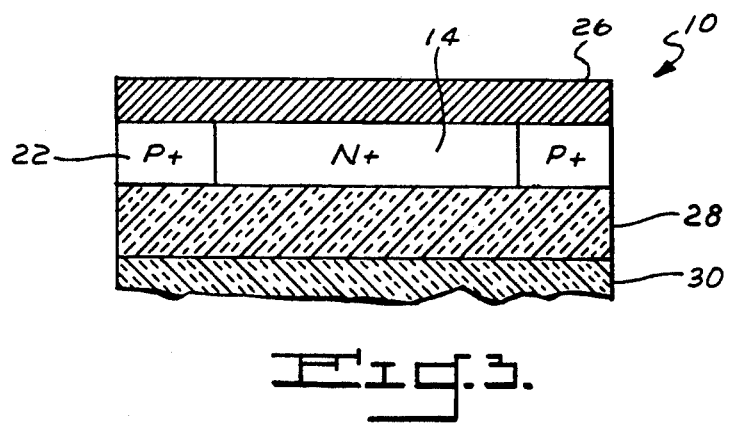
FIG. 3 is another cross-sectional view of the device shown in FIG. 1, taken along line 3—3.

As shown in FIGS. 1-3, the transistor 10 is formed in a single-crystal silicon mesa 20 overlying an insulator film 28 which is formed on a silicon substrate 30. This insulator film 28 is generally silicon dioxide ($SiO_2$), but it could, however, be any suitable dielectric, such as sapphire ($Al_2O_3$) or spinel ($MgAl_2O_4$). The formation of the mesa 20 over the insulator film 28 can be done by any one of a number of methods known in the art, such as SIMOX (Separation by Implanted Oxygen), oxidized porous silicon (FIPOS), or thin zone-melting recrystallization (ZMR). The SIMOX method is described in U.S. Pat. Nos. 3,855,009 and 4,241,359; these patents are hereby incorporated by reference.

Typically, the insulator film 28 is approximately 3500-4000 Å in depth. The silicon substrate 30 underlying the insulator film 28 is typically 400-600 microns in depth.

The gate 12 is separated from the well 18 and its channel 32 by a thin layer of gate oxide 34. This layer of gate oxide 34 is relatively thin, typically less than 350 Å. The gate oxide 34 overlies a P- well region 32, which is doped approximately $5 \times 10^{16} - 5 \times 10^{17}$ atoms per cubic centimeter. On either side of the gate 12 and self-aligned to the gate 12 is a source region 14 and a drain region 16. The gate 12 also terminates in two aperture regions 36, 38.

The gate 12, which is approximately 4500 Å in height, is commonly formed of heavily doped polysilicon. The gate 12 is doped N+ and is doped along the order of $5 \times 10^{19} - 5 \times 10^{20}$ atoms per cubic centimeter. The source region 14 and the drain region 16 are also heavily doped N+. These regions 14, 16 are formed by ion implantation and subsequent diffusion, which is commonly known in the art.

In the first embodiment, extended mesa regions 22, 24 are shown in FIG. 1 and in cross-section in FIGS. 2, 3. A body potential can be fixed by extending mesa regions 22, 24 and doping these regions P type so as to contact the P well 18 under the polysilicon gate 12. Then, contact is made to those P type regions 22, 24 of the silicon. In this preferred embodiment, mesas of the source 14 and body ties 22, 24 are merged and salicide 26 is used to electrically connect the body ties 22, 24 to the source 14. As such, there is a moderately low resistance ohmic connection to the well 18.

In this first embodiment, the well 18 must deplete before the body ties 22, 24. To ensure this, the body tie regions 22, 24 are doped slightly higher than the well 18. This ensures that the body ties 22, 24 are effective until the time of full-depletion. (The doping in the body ties could be as little as 10% more than that in the well 18.) At full depletion, electrical connection to the body ties is severed. At that point, the body ties become ineffective.

Salicide 26, which is commonly known in the art, is any compound containing silicon combined with a refractory metal. Any suitable refractory metal can be used, such as tungsten, titanium, molybdenum, tantalum, cobalt, and platinum.

Fabricating the transistor 10 such that the diodes between the source 14 and the body ties 22, 24 are shorted out includes a number of steps. First, spacers (not shown) are placed around the gate 12 to prevent silicide from forming there. (These spacers are used in relatively short-channel devices to reduce the electric field on the drain side. These spacers are used for any sized device when using salicide because of the need to prevent salicide from forming along the sidewalls of the polysilicon gate 12.) Then, a layer of metal, such as titanium, is deposited and reacted by a diffusion step, forming monosilicide (TiSi). Then, the unreacted titanium is removed by an etching process such that no silicide connects the top of the gate 12 to the top of the source 14. Then, a second diffusion step is performed in order to form the titanium disilicide ($TiSi_2$). This silicidation is useful in reducing sheet resistance of semiconducting layers. Silicidation can be done in any suitable manner, such as commonly-used self-aligned direct react silicidation process, described in U.S. Pat. No. 4,690,730; that patent is hereby incorporated by reference.

Figure 4:
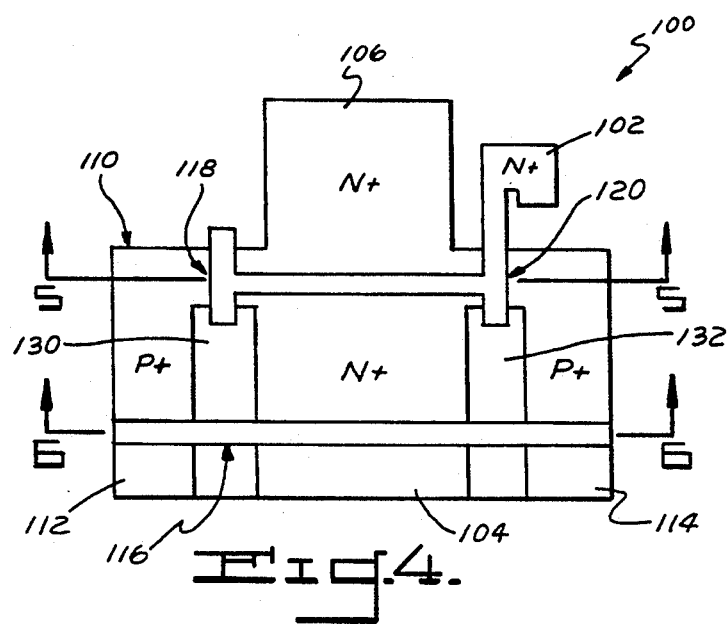
FIG 4 is a top plan view of another preferred embodiment of a body contact constructed in accordance with the present invention, showing the mesas in a non-merged state.
Figure 5:
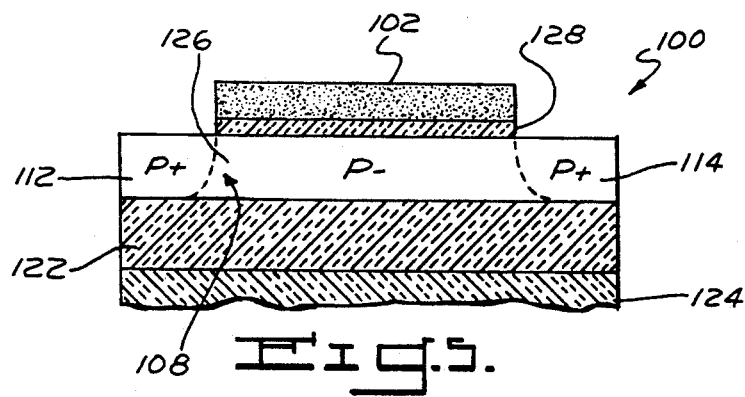
FIG. 5 is a cross-sectional view of the device shown in FIG. 4, taken along line 5—5.
Figure 6:
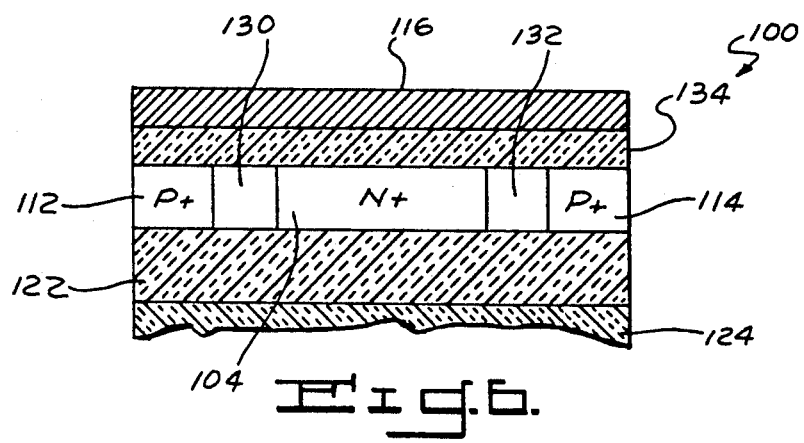
FIG. 6 is another cross-sectional view of the device shown in FIG. 4, taken along line 6—6.

In a second preferred embodiment, shown in FIGS. 4-6, the invention 100 basically comprises a gate 102, a source 104, a drain 106, and a well 108 underlying the gate 102, constructed within a silicon mesa 110, wherein mesa regions 112, 114 extend down to the source 104 but do not merge with the source 104; then body contact is made with metal routing 116, which is commonly used in transistor fabrication to electrically connect the circuit elements. In this preferred embodiment, the metal 116, which is commonly used to connect the circuit elements, is extended to electrically connect body ties 112, 114 to the source or a ground. As in the first embodiment 10, the body ties 112, 114 are active until the onset of full depletion. Then, at the onset of full depletion, the body ties 112, 114 are electrically severed.

The basic transistor 100 is formed in a single-crystal silicon mesa 110 overlying an insulator film 122 which is formed in a silicon substrate 124. The insulator film 122 is generally silicon dioxide, but could, however, be any suitable dielectric, such as sapphire or spinel. See FIGS. 5-6. The formation of the mesa 110 over the insulator film 122 can be done by any suitable method such as SIMOX, FIPOS, or ZMR.

In this preferred embodiment, the insulator film 122 is approximately 3500-4000 Å in depth. The silicon substrate 124 underlying the insulator film 122 is typically 400-600 microns in depth.

The gate 102 is separated from the well 108 and its channel 126 by a thin layer of gate oxide 128. This layer of gate oxide 128 is relatively thin, typically less than 350 Å. See FIG. 5.

The gate 102 is heavily doped polysilicon and is doped along the same order as the gate 12 in the first embodiment 10. The doping of the source 104 and drain 106 is N+ and is of the same magnitude as in the first embodiment 10. Likewise, the source 104 and the drain 106 are formed by ion implantation and subsequent diffusion.

The two mesa regions 112, 114 extend downwardly to the source 104, but do not merge with the source 104. Two apertures 130, 132 separate the two mesa regions 112, 114 from the source 104, as shown in FIG. 4.

In the transistor's fabrication stage, metal routing 116 is applied after completing the source 104 and drain 106 fabrication and activation. See FIG. 6. A layer of oxide or other dielectric 134 is placed over the entire device and small openings (not shown) are cut in the dielectric 134 such that the metal 116 can contact silicon regions 104, 112, 114. Then, the metal routing 166 is put down and patterned. Then, optionally, another dielectric layer (not shown) could be put down over which another metal layer (not shown) could be applied. There could be several layers of dielectric and metal; however, one layer of each will suffice. Finally, a passivation layer is applied.

In this second embodiment 100, the metal 116 is approximately one or more microns in width, with a thickness sufficient to make electrical connection to short out the N+ and P+ regions 104, 112, 114. In this embodiment 100, the same metal that is used to connect the circuit elements is extended to also connect body ties 112, 114. After the metal 116 is routed to the body tie regions 118, 120, there is an ohmic connection to both the source 104 and the body tie regions 112, 114. Consequently, the source 104 and body ties 112, 114 are at the same potential.

In both embodiments 10, 100, the operation of the transistor is substantially similar. The operation of the transistor, as the gate 12, 102 is swept from low to high voltage, is as follows. When, the gate 12, 102 is at low voltage, the body ties 22, 24, 112, 114 connect the well 18, 108 to the source 14, 104. As the gate voltage increases, the stage of full depletion is eventually reached. At full depletion, the body ties 22, 24, 112, 114 are electrically severed from the well 18, 108. This invention, with both embodiments, enables the device to turn "on" reliably and controllably without bipolar snapback being the controlling mechanism within the range of voltage operation. With these embodiments, bipolar snapback occurs at higher voltages than before, and snapback is pushed out of the range of operation. Further, when full depletion occurs, one has a non-body-tied device and can take advantage of a non-body-tied device's higher performance capabilities.

This problem of bipolar snapback is most acute in fully-depleted devices due to the very thin silicon film comprising the well 18, 108. These two embodiments raise the minimal voltage at which snapback typically occurs because they effectively remove the holes from the well and do not allow the holes to accumulate so as to raise the well potential to an unacceptable level— where snapback might occur. Both embodiments pull these holes out and prevent snapback from occurring at lower voltages within the range of operation.

The present method and structure are adapted for use with fully-depleted devices. As is known in the art, applying a potential to a field effect transistor (FET) will deplete the region of silicon under the gate. It is commonly known that the higher the voltage and the lower the doping, the further the depletion region will extend. When the appropriate combination of voltage and doping allows the depleted region to extend to a layer of buried oxide, then the stage of full depletion has been achieved. The present invention takes advantage of the fact that when full depletion has been achieved, the electrical connection to the body is severed; thus, full depletion acts as a switch for connecting the floating body. Because full depletion acts as the switch, one is not required to change or carefully set the threshold voltage. This feature greatly reduces the design and processing considerations.

In both embodiments 10, 100, it should be understood that only one mesa region, such as 22 or 112 could be extended outwardly from the gate.

It should be understood by those skilled in the art that obvious structural modifications can be made without departing from the spirit of the invention. For example, the doping of the transistor could be reversed, thus implementing the invention with P channel surface devices. Accordingly, reference should be made primarily to the accompanying claims rather than the foregoing specification to determine the scope of the invention.

Having thus described the invention, what is claimed is:

1. A transistor formed on an island of silicon over an insulator film over a silicon substrate comprising:
   a. a channel region in the silicon island;
   b. a source region comprising a mesa formed in the silicon island;
   c. a drain region formed in the silicon island and being spaced from the source region and defining the channel region therebetween;
   d. a gate extending over the channel region for controlling surface potential in the channel region;
   e. an insulator region lying between the gate and the channel and separating the gate from the channel region;
   f. at least one body tie region disposed adjacent to and in abutting relation with the channel region and disposed along a predetermined length of the source and being separated from the source by an aperture; and
   g. a layer of metal routing overlying the body tie region and the mesa of the source region for electrically connecting the two regions, wherein electrical connection between the channel region and the body tie region is severed when the channel region achieves full depletion.

2. The transistor of claim 1, wherein the transistor is sufficiently doped to create a P channel device.

3. The transistor of claim 1, wherein the transistor is sufficiently doped to create an N channel device.

4. The transistor of claim 1, wherein a plurality of body tie regions extend outwardly from the gate and extend to the mesa of the source region.

5. The transistor of claim 1, wherein the insulator film comprises silicon dioxide.

6. The transistor of claim 1, wherein the insulator film comprises sapphire.

7. The transistor of claim 1, wherein the insulator film comprises spinel.

8. A transistor formed on an island of silicon over an insulator film over a silicon substrate comprising:
   a. a channel region in the silicon island;
   b. a source region comprising a mesa formed in the silicon island;
   c. a drain region formed in the silicon island and being spaced from the source region and defining the channel region therebetween;

d. a gate extending over the channel region for controlling surface potential in the channel region;
e. an insulator region lying between the gate and the channel and separating the gate from the channel region;
f. at least one body tie region disposed adjacent to and in abutting relation with the channel region and disposed along a predetermined length of the source and being separated from the source by an aperture; and
g. a means for electrically connecting the source to the body tie, wherein electrical connection between the channel region and the body tie region is severed when the channel region achieves full depletion.

9. The transistor device of claim 8, wherein the means for electrically connecting the two regions comprises a layer of metal routing overlying the body tie region and the mesa of the source region sufficiently so as to make electrical connection.

10. The transistor of claim 8, wherein the transistor is sufficiently doped to create an P channel device.

11. The transistor of claim 8, wherein the transistor is sufficiently doped to create an N channel device.

12. The transistor of claim 8, wherein a plurality of body tie regions extend outwardly from the gate and extend to the mesa of the source region.

13. The transistor of claim 8, wherein the insulator film comprises silicon dioxide.

14. The transistor of claim 8, wherein the insulator film comprises sapphire.

15. The transistor of claim 8, wherein the insulator film comprises spinel.

* * * * *